(12) United States Patent
Nairn

(10) Patent No.: US 7,084,674 B1
(45) Date of Patent: Aug. 1, 2006

(54) DIFFERENTIAL AMPLIFIER WITH REDUCED COMMON-MODE AND METHOD

(75) Inventor: David G. Nairn, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 136 days.

(21) Appl. No.: 10/919,552

(22) Filed: Aug. 16, 2004

(51) Int. Cl.
*H03K 5/22* (2006.01)

(52) U.S. Cl. .......................................... 327/67; 327/66

(58) Field of Classification Search ................. 327/54, 327/67, 73, 87; 330/258–260, 271, 291
See application file for complete search history.

(56) References Cited

U.S. PATENT DOCUMENTS

| | | | |
|---|---|---|---|
| 3,955,149 A * | 5/1976 | Trilling | ........................ 330/258 |
| 4,742,308 A | 5/1988 | Banu | |
| 5,006,817 A * | 4/1991 | Babanezhad | ................. 330/253 |
| 5,146,114 A | 9/1992 | Feldtkeller | |
| 5,220,286 A | 6/1993 | Nadeem | |
| 5,596,289 A | 1/1997 | Liu | |
| 6,011,436 A | 1/2000 | Koike | |
| 6,265,941 B1 * | 7/2001 | Lopata | ........................ 330/258 |
| 6,346,832 B1 * | 2/2002 | Young | ........................ 327/108 |
| 6,359,510 B1 | 3/2002 | Ishii et al. | |
| 6,400,301 B1 | 6/2002 | Kulhalli et al. | .............. 341/155 |
| 6,605,964 B1 | 8/2003 | Nakada | |

OTHER PUBLICATIONS

Johns, David et al., *Analog Integrated Circuit Design*, New York: John Wiley & Sons, Inc., 1997, pp. 280-281, 287-291.

* cited by examiner

*Primary Examiner*—My-Trang Nu Ton
(74) *Attorney, Agent, or Firm*—Koppel, Patrick & Heybl

(57) ABSTRACT

A comparator includes a circuit which provides a plurality of common-mode difference signals in response to differential input signals. The circuit provides a common-mode feedback signal in response to the plurality of common-mode difference signals. The common-mode feedback signal is used to drive the common-mode level of an amplifier to a desired value.

22 Claims, 4 Drawing Sheets

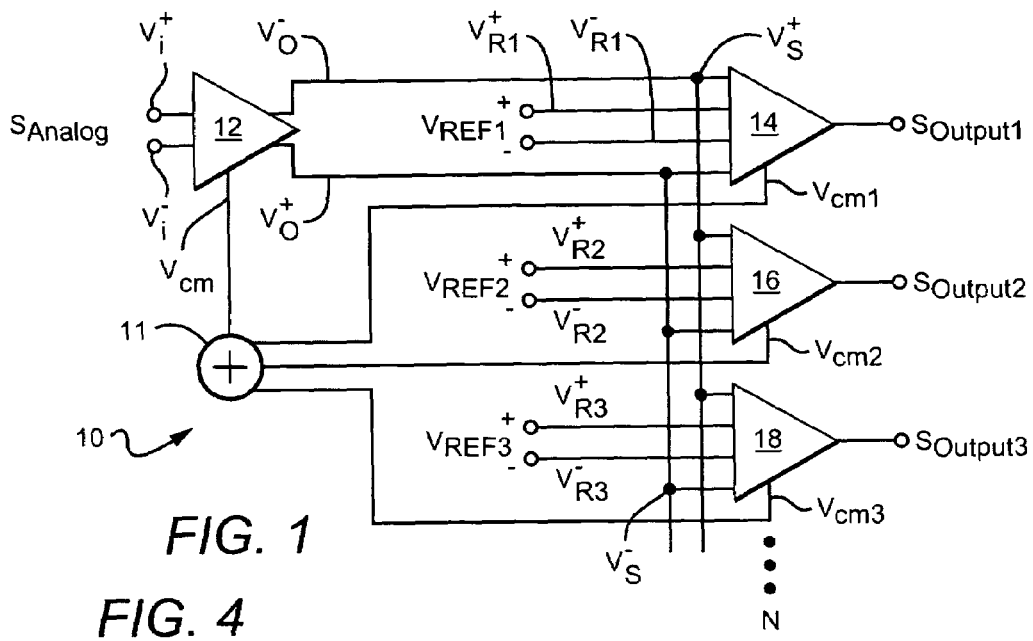
FIG. 1
FIG. 4
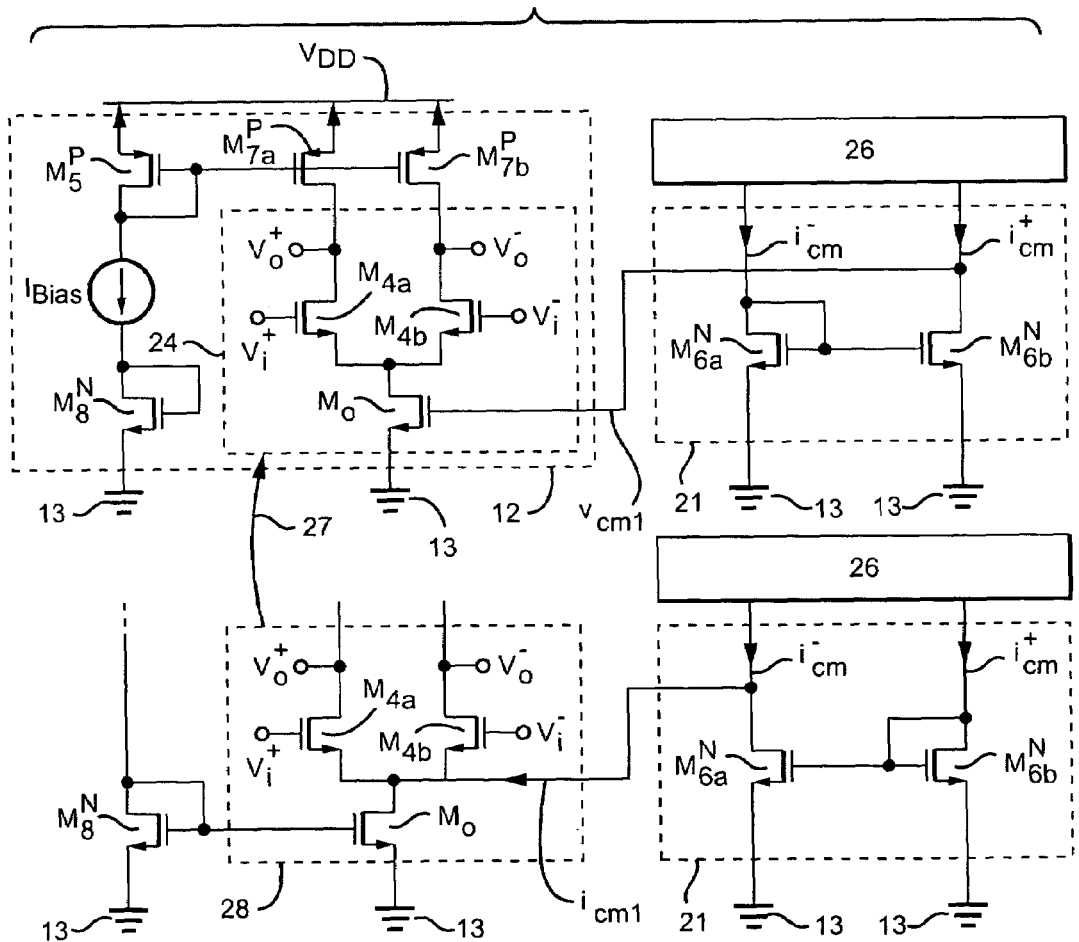

DIFFERENTIAL AMPLIFIER WITH REDUCED COMMON-MODE AND METHOD

BACKGROUND OF THE INVENTION

1. Field of the Invention

This invention relates generally to electronic circuits and, more particularly, to electronic circuits which provide common-mode feedback signals.

2. Description of the Related Art

For high performance signal conditioning systems, many analog circuits use dual output differential amplifiers. Differential amplifiers amplify the difference between inverting and non-inverting input signals and allow the rejection of noise from the substrate and clock signals coupled to the amplifier. However, differential amplifiers also amplify the average of the inverting and non-inverting input signals which is generally referred to as the common-mode.

The common-mode is characterized by the common-mode rejection ratio (CMRR) which is defined as the ratio of the differential to the common-mode gain. Hence, the CMRR can be increased by reducing the common-mode gain. In some differential amplifiers, the common-mode gain can be reduced by using switched capacitor circuitry, as disclosed in U.S. Pat. No. 6,400,301. The common-mode gain can also be reduced by using continuous time circuitry, as disclosed in D. A. Johns and K. Martin, Analog Integrated Circuit Design, John Wiley and Sons, New York, 1997, Pgs 287–291.

In a typical differential amplifier circuit, the the amplifier and its common-mode feedback (CMFB) circuitry are separate from any circuitry that may follow the differential amplifier. For example, in some analog-to-digital converter (ADC) applications the differential amplifier drives a comparator that compares a sample of the analog input signal to a reference voltage, which is typically a positive or negative differential voltage.

One type of comparator is known as a quad or differential difference comparator. These comparators receive input signals ($V_S^+$ and $V_S^-$) and reference signals ($V_R^+$ and $V_R^-$). Comparators of this type have an offset that is dependent on the difference between the common-mode of the input and reference signals. As the magnitude of the offset increases, the comparator's gain decreases, which reduces its effectiveness to operate as a comparator.

To increase the CMRR of the quad comparator, external CMFB circuitry is typically added between the differential amplifier and the comparator to establish the differential amplifier's common-mode output voltage. The CMFB circuitry is designed to make the common-mode voltages of the amplifier's output signal and comparator's reference signal the same. The external circuitry, however, increases the physical size of the circuit and makes the overall design more complicated.

SUMMARY OF THE INVENTION

The present invention provides a comparator with a circuit which outputs common-mode difference signals in response to differential input and reference signals. The outputted common-mode difference signals are used to provide common-mode feedback signals.

The comparator can be included in a signal conditioning system which has an amplifier circuit that provides differential amplifier output signals in response to differential amplifier input signals. One or more comparators can be coupled to the amplifier circuit, in which each comparator receives the differential amplifier output signals. Each comparator provides its common-mode feedback signal in response to the differential amplifier output signals and corresponding differential reference signals. The common-mode feedback signals from each comparator are provided to the amplifier to drive its common-mode level to a desired value.

These and other features, aspects, and advantages of the present invention will become better understood with reference to the following drawings, description, and claims.

BRIEF DESCRIPTION OF THE DRAWINGS

FIG. 1 is a simplified block diagram of a signal conditioning system with an amplifier coupled to three comparators in accordance with one embodiment of the invention;

FIG. 4 is a schematic diagram of a common-mode output circuit shown in FIG. 3.

DETAILED DESCRIPTION OF THE INVENTION

Figure 2:
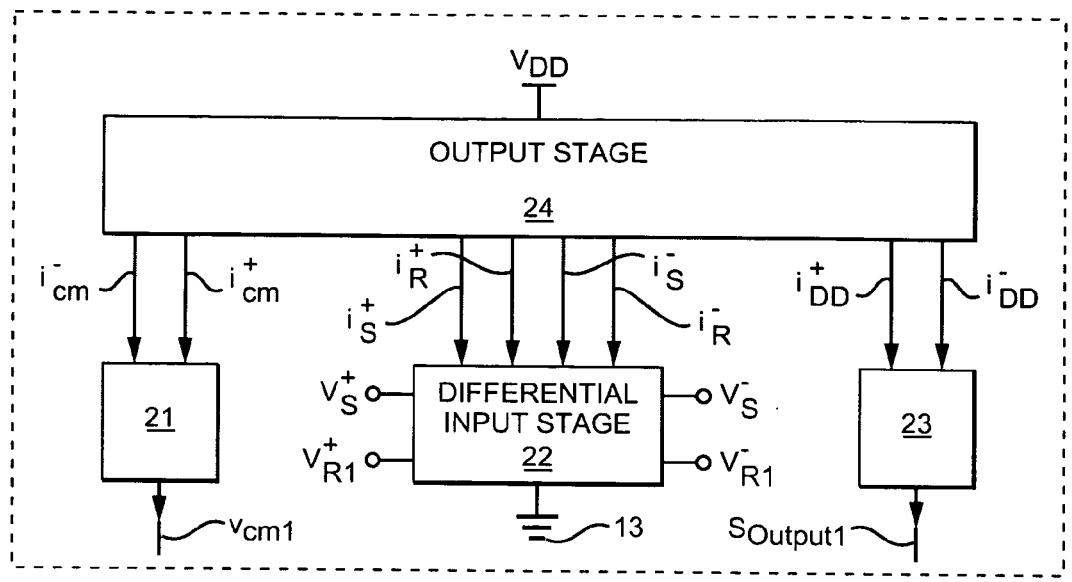
FIG. 2 is a simplified block diagram of a possible implementation for one of the comparators shown in FIG. 1.

FIG. 1 shows a simplified block diagram of a signal conditioning system 10 which operates as an analog-to-digital (ADC) converter. System 10 includes an operational amplifier 12 coupled to quad-comparators 14, 16, and 18 (i.e. "the comparators"). Amplifier 12 receives input signals $v_i^+$ and $v_i^-$ at respective input terminals $V_i^+$ and $V_i^-$ and provides output signals $v_o^+$ and $v_o^-$ at respective output terminals $V_o^+$ and $V_o^-$. Amplifier 12 also has a common-mode terminal $V_{cm}$ which provides its common-mode level. Here and in the following discussion, a physical terminal or component will be indicated with a capital letter and a signal or a measurable value will be indicated with a lower case letter. For example, the output terminals are referred to as $V_o^+$ and $V_o^-$ while signals at the respective output signals are referred to as $v_o^+$ and $v_o^-$. It should also be noted that a signal or terminal with a superscript plus sign (+) or negative sign (−) indicates a non-inverting and inverting signal or terminal, respectively.

Terminals $V_o^+$ and $V_o^-$ are connected to input terminals $V_s^-$ and $V_s^-$, respectively, of each comparator. Each comparator includes separate reference terminals $V_R^+$ and $V_R^-$ which receive respective differential reference signals $v_{REF1} = v_{R1}^+ - v_{R1}^-$, $v_{REF2} = v_{R2}^+ - v_{R2}^-$, and $v_{R3}^+ - v_{R3}^-$ (i.e. "the reference signals"). The comparators provide respective output signals $S_{Output1}$, $S_{Output2}$, and $S_{Output3}$ in response to $S_{Analog}$ and the reference signals. Signals $S_{Output1}$, $S_{Output2}$, and $S_{Output3}$ can be digital signals corresponding to $S_{Analog}$. System 10 can include N comparators, but only three are shown for simplicity and ease of discussion.

The average of signals $v_o^+$ and $v_o^-$ is the common-mode level, which is denoted as $v_{cm}^{avg}$. The desired common-mode level at terminal $V_{cm}$ is referred to as $v_{cm}$ and the difference between signals $v_{cm}^{avg}$ and $v_{cm}$ (i.e. $v_{cm} - v_{cm}^{avg}$) is referred to as the common-mode variation. Terminal $V_{cm}$ is connected to terminals $V_{cm1}$, $V_{cm2}$, and $V_{cm3}$ of the respective comparators through an adder 11 so that the combination of the common-mode signals from all of the comparators drives the common-mode level of the amplifier to the desired common-mode level (i.e. $v_{cm}^{avg} - v_{cm} = v_{cm1} + v_{cm2} + v_{cm3}$) However, in some examples only one of the common-mode signals from the comparators can be used. In the following discussion, it is desired to drive the difference between signals $v_{cm}^{avg}$ and $v_{cm}$ to zero so that the common-mode variation is reduced. It is also typically desired to reduce the changes in the common-mode variation as a function of time.

The common-mode signals from the comparators can be set by choosing their corresponding differential reference signals $v_{REF1}$, $v_{REF2}$, and $v_{REF3}$. For example, if signal $v_{cm}$ is desired to be zero volts, then the reference voltages can be chosen so that their average is zero. One way to do this is to make $v_{R1}^+$ and $v_{R1}^-$ both equal to 0.0 volts, $v_{R2}^+$ and $v_{R2}^-$ equal 0.5 and −0.5 volts, respectively, and $v_{R3}^+$ and $v_{R3}^-$ equal to 1.0 and −1.0 volts, respectively, so that $v_{cm1}$, $v_{cm2}$, and $v_{cm3}$ are equal to 0.0 volts ($v_{cm1} = (v_{R1}^+ + v_{R1}^-)/2$, $v_{cm2} = (v_{R2}^+ + v_{R2}^-)/2$, and $v_{cm3} = (v_{R3}^+ - v_{R3}^-/2)$. In another example, $v_{cm}$ can be equal to 1.0 volt by making $v_{R1}^+$ and $v_{R1}^-$ both equal to 1.0 volt. Signals $v_{R2}^+$ and $v_{R2}^-$ can equal 0.5 and 1.5 volts, respectively, and $v_{R3}^+$ and $v_{R3}^-$ can equal 2.0 and 0.0 volts, respectively, so that $v_{cm1}$, $v_{cm2}$, and $v_{cm3}$ are equal to 1.0 volt. Hence, the common-mode levels of amplifier 12 and the comparators can be controlled and the common-mode variations can be reduced by choosing the reference signals.

FIG. 2 shows a simplified block diagram of comparator 14. The block diagrams for comparators 16 and 18 are similar, but are not shown for simplicity and ease of discussion. Comparator 14 includes a differential input stage 22 which receives differential currents $i_S^+$, $i_S^-$, $i_R^+$ and $i_R^-$ from an output stage 24. Input stage 22 receives input signals $v_S^+$ and $v_S^-$ from amplifier 12 and signals $v_{R1}^+$ and $v_{R1}^+$ from a corresponding adjustment circuit (not shown). The adjustment circuit can include an adjustable power supply, for example.

Stage 24 provides both inverting and non-inverting common-mode difference currents $i_{CM}^-$ and $i_{CM}^+$ to a common-mode output stage 21. Stage 24 also provides inverting and non-inverting differential difference currents $i_{DD}^-$ and $i_{DD}^+$ to a comparator output stage 23, so that stages 21 and 23 provide signals $v_{cm1}$ and $S_{Output1}$, respectively. Comparator 14 is driven by a potential difference between a power source $V_{DD}$ and a current return 13. Current return 13 can include a voltage terminal with a reference potential. However, in the embodiments shown, current return 13 is illustrated as a ground terminal (i.e. AC and DC ground).

In operation, stages 22 and 24 include circuitry circuitry which is coupled together so that $i_S^+ = (i_B + g_m(v_S^+ - v_{R1}^+))/2$, $i_R^+ = (i_B + g_m(v_{R1}^+ - v_S^+))/2$, $i_S^- = (i_B + g_m(v_S^- - v_R^-))/2$, and $i_R^- = (i_B + g_m(v_R^- - v_S^-))/2$, where $g_m$ is the transconductance of the transistors used to provide the respective currents. Here, it is assumed for simplicity and ease of discussion that all of the transistors have the same transconductance.

Stage 24 includes circuitry to mirror these currents to stage 21 so that $i_{CM}^+ = i_S^+ + i_S^- = i_B + g_m((v_S^+ + v_S^-) - (v_R^+ + v_R^-))/2$ and $i_{CM}^- = i_R^+ + i_R^- = i_B + g_m((v_R^+ + v_R^-) - (v_S^+ + v_S^-))/2$. Likewise, stage 24 includes circuitry to mirror these currents to stage 23 so that $i_{DD}^+ = i_S^+ + i_R^- = i_B + g_m((v_S^+ - v_S^-) - (v_R^+ - v_R^-))/2$ and $i_{DD}^- = i_R^+ + i_S^- = i_B + g_m((v_R^+ - v_R^-) - (v_S^+ - v_S^-))/2$. Currents $i_{CM}^+$ and $i_{CM}^-$ are combined by stage 21 to provide $v_{cm1}$ and currents $i_{DD}^+$ and $i_{DD}^-$ are combined by stage 23 to provide $S_{Output1}$. Signal $v_{cm1}$ is fedback to amplifier 12 (see FIG. 1) to reduce the common-mode difference between amplifier 12 and comparator 14.

Figure 3:
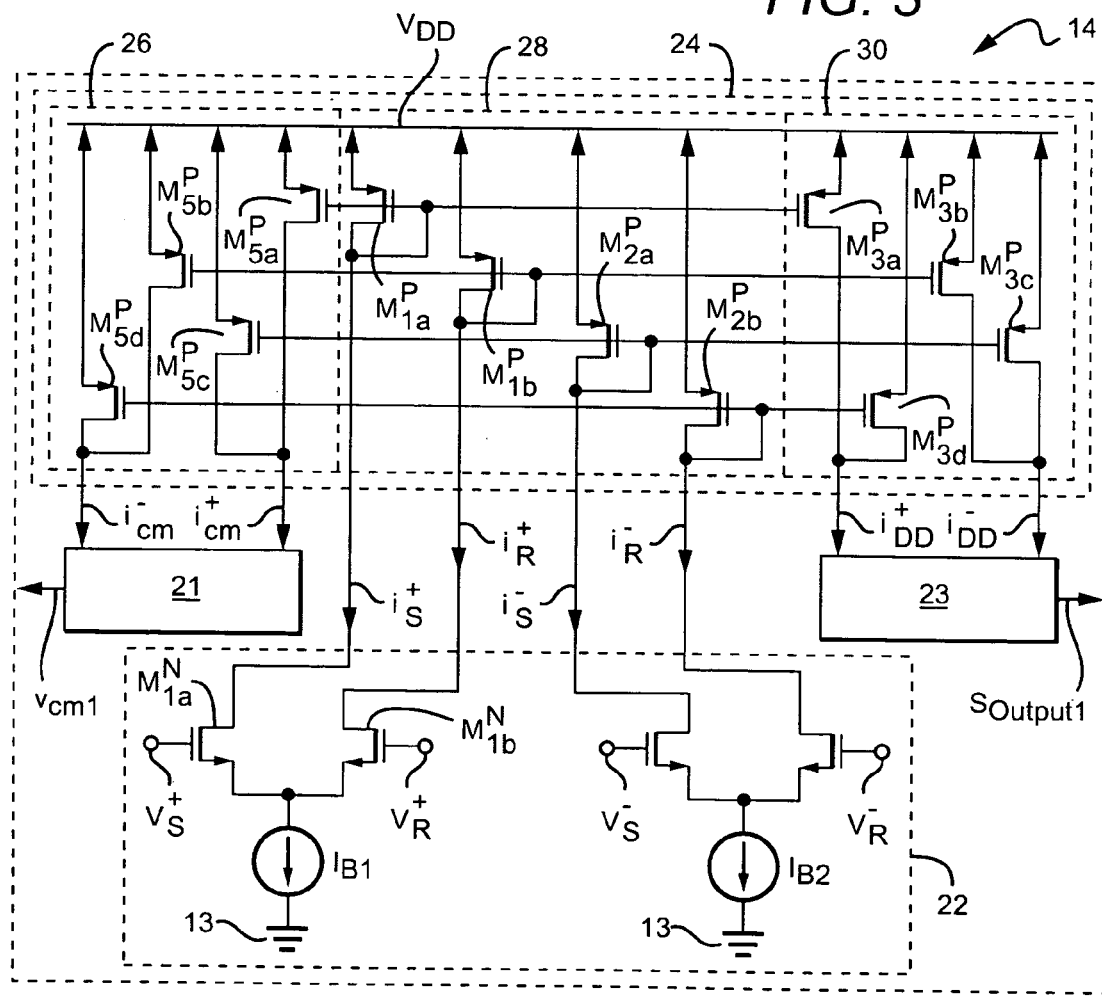
FIG. 3 is a schematic diagram of the comparator shown in FIG. 2.

FIG. 3 illustrates a circuit schematic of comparator 14. Input stage 22 includes two differential amplifiers with NMOS transistor pairs $M_{1a}^N$, $M_{1b}^N$ and $M_{2a}^N$, $M_{2b}^N$. The control terminals of transistors $M_{1a}^N$, $M_{1b}^N$, $M_{2a}^N$, and $M^{2bN}$ are connected to terminals $V_S^+$, $V_{R1}^+$, $V_S^-$, and $V_{R1}^-$, respectively. Transistor pair $M_{1a}^N$ and $M_{1b}^N$ are coupled together to provide currents $i_S^+$ and $i_R^+$ and transistor pair $M^{2aN}$ and $M_{2b}^N$ are coupled together to provide currents $i_S^-$ and $i_R^-$. The sources of transistors $M_{1a}^N$ and $M_{1b}^N$ are connected to current return 13 through a current source $I_{B1}$, which sets their bias point. The sources of transistors $M_{2a}^N$ and $M_{2b}^N$ are connected to current return 13 through a current source $I_{B2}$, which sets their bias point. Hence, current sources $I_{B1}$ and $I_{B2}$ operate as current sinks for their respective differential amplifier pairs.

Stage 24 includes a current-to-voltage converter circuit 28 coupled between voltage-to-current converter circuits 26 and 30. Circuit 28 includes diode connected PMOS transistors $M_{1a}^P$, $M_{1b}^P$, $M_{2a}^P$, and $M_{2b}^P$. Drains of transistors $M^{1aP}$ and $M_{1b}^P$ are coupled to drains of transistors $M_{1a}^N$ and $M_{1b}^N$, respectively, and drains of transistors $M_{2a}^P$ and $M_{2b}^P$ are coupled to drains of transistors $M_{2a}^N$ and $M_{2b}^N$, respectively. Sources of transistors $M_{1a}^P$, $M_{1b}^P$, $M_{2b}^P$, and $M_{2b}^P$ are coupled to power source $V_{DD}$. Transistors $M_{1a}^P$, $M_{1b}^P$, $M_{2a}^P$, and $M_{2b}^P$ each include separate control terminals in which the control terminals of transistors $M_{1a}^P$, $M_{1b}^P$, $M_{2a}^P$, and $M_{2b}^P$ are coupled to circuits 26 and 30.

Circuit 26 includes PMOS transistors $M_{5a}^P$, $M_{5b}^P$, $M_{5c}^P$ and $M_{5d}^P$. The control terminals of transistors $M_{5a}^P$ and $M^{5bP}$ are coupled to the control terminals of transistors $M_{1a}^P$ and $M_{1b}^P$, respectively, and the control terminals of transistors $M_{5c}^P$ and $M_{5d}^P$ are coupled to the control terminals of transistors $M_{2a}^P$ and $M_{2b}^P$, respectively. The sources of transistors $M_{5a}^P$, $M_{5b}^P$, $M_{5c}^P$ and $M_{5d}^P$ are coupled to power source $V_{DD}$. The drains of transistors $M_{5b}^P$ and $M_{5d}^P$ are coupled together to provide current $i_{CM}^-$ and the drains of transistors $M_{5a}^P$ and $M_{5c}^P$ are coupled together to provide current $i_{CM}^+$.

Circuit 30 includes transistors $M_{3a}^P$, $M_{3b}^P$, $M_{3c}^P$ and $M_{3d}^P$. The control terminals of transistors $M_{3a}^P$ and $M_{3b}^P$ are coupled to the control terminals of transistors $M_{1a}^P$ and $M_{1b}^P$, respectively, and the control terminals of transistors $M^{3cP}$ and $M_{3d}^P$ are coupled to the control terminals of transistors $M_{2a}^P$ and $M_{2b}^P$, respectively. The sources of transistors $M_{3a}^P$, $M_{3b}^P$, $M_{3c}^P$ and $M_{3d}^P$ are coupled to power source $V_{DD}$. The drains of transistors $M_{3a}^P$ and $M_{3d}^P$ are coupled together to provide current $i_{DD}^+$ and the drains of transistors $M_{3b}^P$ and $M_{3c}^P$ are coupled together to provide current $i_{DD}^-$.

In operation, circuit 28 converts currents $i_S^+$, $i_R^+$, $i_S^-$, and $i_R^-$ to voltages at the control terminals of transistors $M_{1a}^P$, $M_{1b}^P$, $M_{2a}^P$, and $M_{2b}^P$, respectively. The voltages are provided to circuits 26 and 30 where they are converted to currents and combined to provide currents $i_{CM}^+$, $i_{CM}^-$, $i_{DD}^+$, and $i_{DD}^-$.

FIG. 4 illustrates a more detailed schematic diagram of stage 21 and operational amplifier 12. Here, stage 21 provides voltage feedback to amplifier 12 with signal $v_{cm1}$. Stage 21 includes NMOS transistors $M_{6a}^N$ and $M_{6b}^N$ with respective sources connected to current return 13. Drains of transistors $M_{6a}^N$ and $M_{6b}^N$ are connected to converter circuit 26 and receive currents $i_{cm}^-$ and $i_{cm}^+$, respectively. The gates of transistors $M_{6a}^N$ and $M_{6b}^N$ are connected together and to the drain of transistor $M_{6a}^N$ so that $M_{6a}^N$ is diode connected. The drain of transistor $M_{6b}^N$ provides signal $v_{cm1}$ which is added to signals $v_{cm2}$ and $v_{cm3}$ (see FIG. 1) to provide $v_{cm}^{avg} - v_{cm}$ to the gate of an NMOS transistor $M_0^N$ included in amplifier 12. However, the addition of signals $v^{cm1}$, $v_{cm2}$, and $v_{cm3}$ is not shown in FIG. 4 for simplicity and ease of discussion. The source of transistor $M_0{}^N$ is connected to current return 13 and its drain is connected to sources of a differential amplifier pair which includes transistors $M_{4a}{}^N$ and $M_{4b}{}^N$. Transistor $M_0{}^N$ operates as a current sink for $M_{4a}{}^N$ and $M_{4b}{}^N$ which is modulated by $v_{cm}{}^{avg}-v_{cm}{}^N=v_{cm1}$.

Drains of PMOS transistors $M_{7a}{}^P$ and $M_{7b}{}^P$ are connected to drains of transistors $M_{6a}{}^N$ and $M_{6b}{}^N$ respectively, and provide respective output signals $v_o{}^+$ and $v_o{}^-$. Sources of transistors $M_{6a}{}^N$ and $M_{6b}{}^N$ are connected to current return 13. A diode connected transistor $M_5{}^N$ has a control terminal connected to the control terminals of transistors $M_{7a}{}^N$ and $M^{7bN}$ and a source terminal connected to $V_{DD}$. The drain of transistor $M_5{}^N$ is connected to a current source $I_{Bias}$ which is connected to current return 13 through a diode connected NMOS transistor $M_8{}^N$.

In operation, the drains of transistors $M_{6a}{}^N$ and $M_{6b}{}^N$ receive signals $i_{CM}{}^-$ and $i_{CM}{}^+$, respectively, from converter circuit 26. Transistor $M_{6a}{}^N$ is diode connected so that $i_{CM}{}^-$ determines its gate voltage. Since the gates of transistors $M^{6aN}$ and $M_{6b}{}^N$ are connected together and they share a common source connection, transistor $M_{6b}{}^N$ will also conduct a current equal to $i_{CM}{}^-$. Signal $i_{CM}{}^-$ is subtracted subtracted from $i_{CM}{}^+$ at the drain node of $M_{6b}{}^N$ (Kirchoff's Law) and the difference is provide to transistor $M_0{}^N$. The difference between signals $i_{CM}{}^+$ and $i_{CM}{}^-$ is given by $g_{ml}[(v_S{}^++v_S{}^-)-(v_R{}^++v_R{}^-)]$.

When the common-mode of comparator 14 is too high, $i_{CM}{}^+$ will be greater than $i_{CM}{}^-$ and the current imbalance causes the voltage at the drain node of $M_{6b}{}^N$ to increase. The voltage is caused because this node is a relatively high impedance node. Since the drain of $M_{6b}{}^N$ is also connected to the control terminal of $M_0{}^N$, the increased voltage increases the current sunk by $M_0{}^N$. This increased current reduces the common-mode voltage of amplifier 12 and operates to reduce the difference between currents $i_{CM}{}^+$ and $i_{CM}{}^-$. When the common-mode of the circuit is too low, $i_{CM}{}^+$ will be less than $i_{CM}{}^-$ and the current imbalance causes the voltage at the drain of $M_{6b}{}^N$ to decrease. In this case, the decreased voltage decreases the current sunk by $M_0{}^N$ and reduces the difference between $i_{CM}{}^+$ and $i_{CM}{}^-$.

Circuit 26 can be replaced by a circuit 28 as indicated by substitution arrow 27 if circuit 21 is reconnected so that transistor $M_{6b}{}^N$ is diode connected and transistor $M_{6a}{}^N$ is not. In this configuration, the drain of transistor $M_{6a}{}^N$ is connected to the drain of transistor $M_0{}^N$. In circuit 28, the control terminal of transistor $M_0{}^N$ is biased by connecting it to the control terminal of transistor $M_8{}^N$. Here, a common-mode current $i_{cm}$ is provided to the sources of transistors $M^{4aN}$ and $M_{4b}{}^N$. Current $i_{cm}$ is equal to the difference between $i_{CM}{}^-$ and $i_{CM}{}^+$ so that circuit 21 provides current feedback instead of voltage feedback as in circuit 26.

Figure 5A:
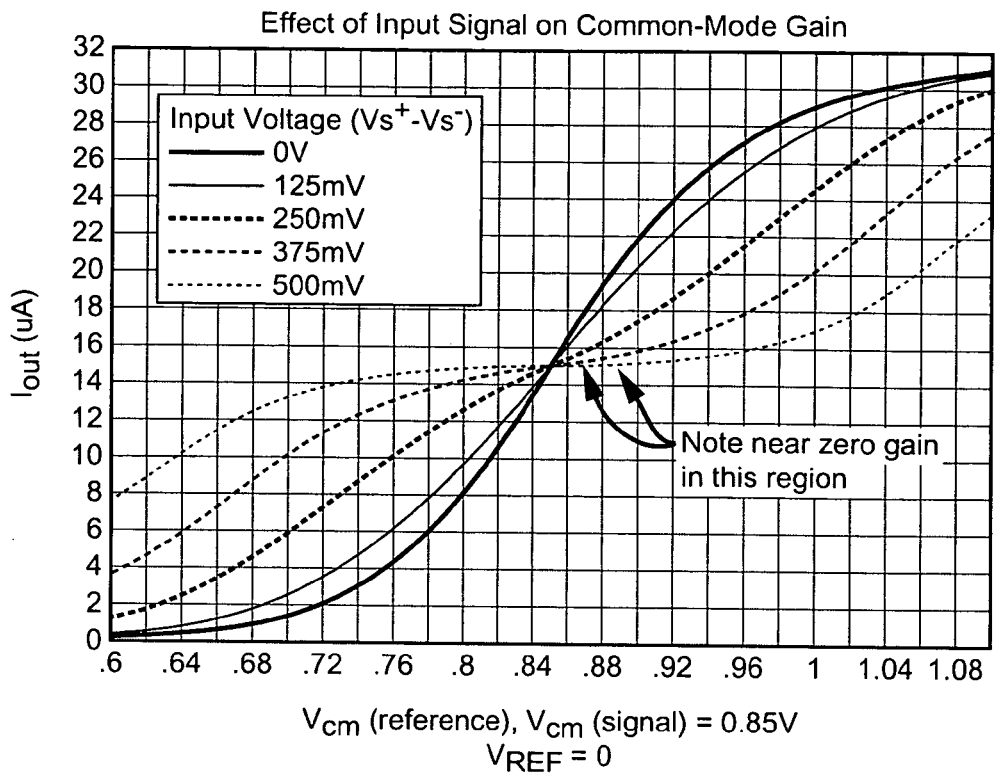
FIGS. 5a, 5b, and 5c are graphs showing the effect of the input signal on the common-mode gain for the circuit of FIG. 4.
Figure 5B:
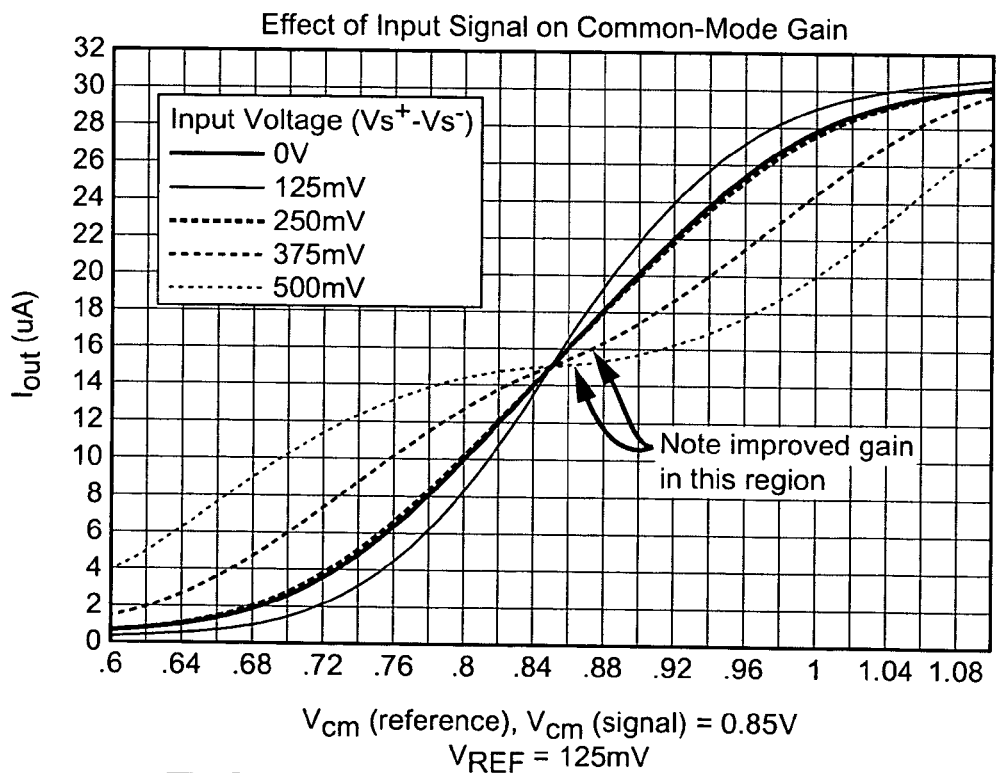
Figure 5C:
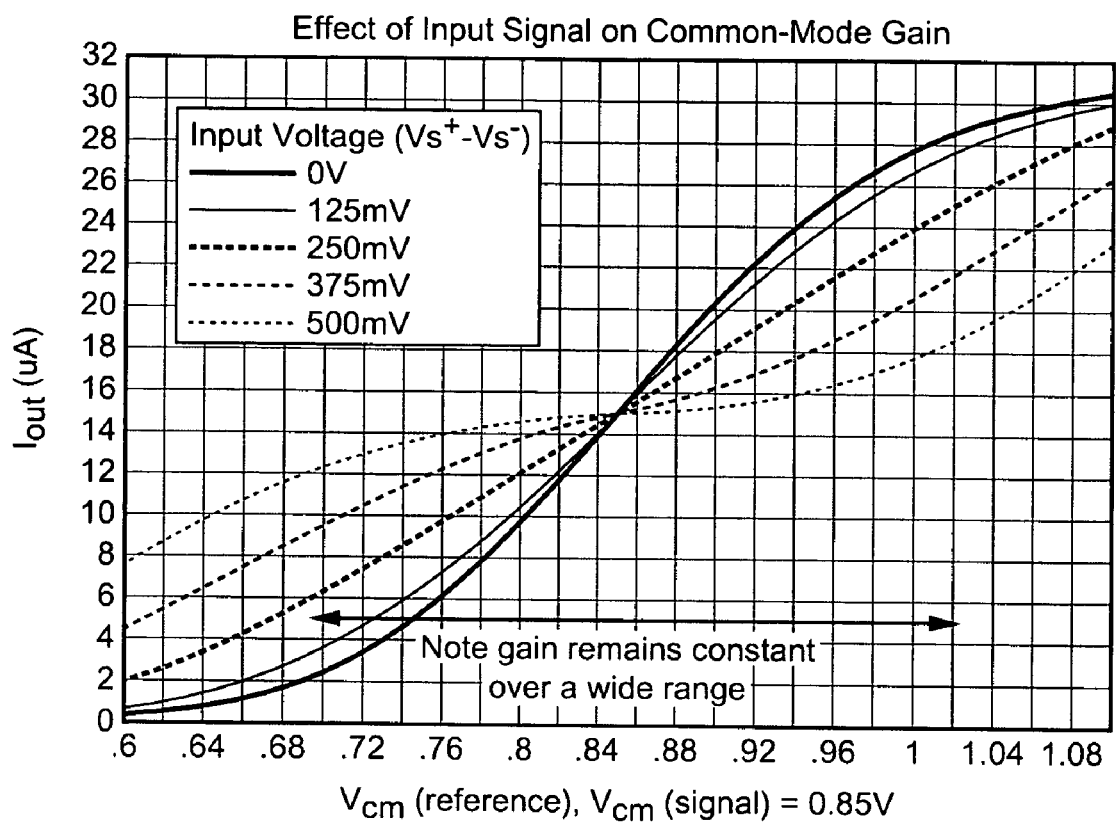

FIGS. 5a, 5b, and 5c show graphs of the output current $I_{out}$ (μA) verses $V_{CM}$ (mV) for differential input signal ($v_S{}^+-v_S{}^-$) values of 0 mV, 125 mV, 250 mV, 375 mV, and 500 mV. FIGS. 5a and 5b show the result when $V_{REF1}$ is equal to 0.0 mV and 125 mV, respectively, and system 10 in FIG. 1 includes comparator 14 coupled to amplifier 12 (i.e. N=1). Here, the output current is equal to $I_{CM}{}^+$. FIG. 5c shows the result when system 10 includes both comparators 14 and 16 coupled to amplifier 12 and $V_{REF1}$=125 mV and $V_{REF2}$=−125 mV (i.e. N=2). In FIG. 5c, the output current is the sum of $I_{CM}{}^+$ from both comparators 14 and 16, where the current has been divided by a factor of two for easy comparison with FIGS. 5a and 5b.

In the figures, it is desired to have a linear curve with a large slope for $I_{out}$ over a wide range of input signals. Hence, it is desired to minimize the range of $V_{cm}$ values over which the slope of $I_{out}$ is zero. This is done by choosing the value of the reference signals to match the common-mode voltages of the comparator(s) and amplifier. For example, in FIG. 5a, $I_{out}$ is linear over the range of the graph when the input signal is equal to 250 mV. $I_{out}$ is approximately linear when the input signal is equal to 0 mV or 125 mV for a narrow range of $V_{cm}$ values (between about 0.76 mV and 0.93 mV). $I_{out}$ is very non-linear for $V_{cm}$=375 mV and $V_{cm}$=500 mV in which it has a zero or small slope between about 0.76 mV and 0.93 mV.

In FIG. 5b, however, $I_{out}$ is linear over the range of the graph when the input signal is equal to 375 mV. $I_{out}$ is approximately linear when the input signal is equal to 0 mV, 125 mV, or 250 mV for a wider range of $V_{cm}$ values (between about 0.74 mV and 0.95 mV). $I_{out}$ is still non-linear for $V_{cm}$=500 mV, but it is non-linear with a small slope over a smaller range of $V_{cm}$ values (from 0.78 mV to about 0.92 mV). Hence, the addition of a non-zero reference voltage increases the range of input signals for which comparator 14 has a high gain and a linear slope.

FIG. 5c shows that a further improvement in the performance of system 10 can be obtained by including more than one comparator, each with a different reference signal. Here, when $V_{REF1}$=125 mV and $V_{REF2}$=−125 mV, the range of input signals in which a high gain is achieved is increased. $I_{out}$ is linear over the range of the graph when the input signal is equal to 375 mV. $I_{out}$ is approximately linear when the input signal is equal to 0 mV or 125 mV for a wider range of $V_{cm}$ values (between about 0.72 mV and 0.96 mV).

The slope of the curve in FIG. 5c becomes more linear over a wider range of common-mode signals because the common-mode output signal is now the sum of the output signals from both comparators 14 and 16. Hence, the range of output signals over which the common-mode detector displays a high gain can be increased depending on the values of the reference signals chosen and the number of comparators used.

A further advantage of using multiple comparators is that the comparator's speed is not reduced as much. If two comparators are included in system 10, then the transistors included in each current-to-voltage converter circuit 28 only need to be half as wide. For example, if the diode connected PMOS transistors $M_{1a}{}^P$, $M_{1b}{}^P$, $M_{2a}{}^P$, and $M_{2b}{}^P$ (See FIG. 3) are full size, $M_{3a}{}^P$, $M_{3b}{}^P$, $M_{3c}{}^P$, and $M_{3d}{}^P$ are full size and $M_{5a}{}^P$, $M_{5b}{}^P$, $M_{5c}{}^P$, and $M_{5d}{}^P$ are full size, then the total capacitance on the diode connected nodes will be 50% higher than without the presence of $M_{5a}{}^P$, $M_{5b}{}^P$, $M_{5c}{}^P$ and $M_{5d}{}^P$ which leads to a 33% reduction in speed. However, if transistors $M_{5a}{}^P$, $M_{5b}{}^P$, $M_{5d}{}^P$, and $M_{5d}{}^P$ are made half-size, then the capacitance is only 25% higher for a 20% reduction in speed. More comparators can be included to further reduce the capacitance and speed reduction percentage.

The polarity of the various transistors included in system 10 can be changed from NMOS to PMOS or from PMOS to NMOS. Further, system 10 can include bipolar junction transistors or other types of field effect transistors. Hence, the type and the polarity of the transistors included in system 10 are chosen for simplicity and ease of discussion and are not meant to limit the scope of the invention.

Thus, a comparator which provides multiple common-mode difference and differential difference signals has been disclosed. The common-mode difference signals can be used to provide a common-mode feedback signal to an amplifier to reduce common-mode variations between the amplifier and the comparator. The differential difference signals can be used to provide a digital output signal which corresponds to a differential analog signal provided to the input of the amplifier.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A comparator, comprising:
a circuit which provides a plurality of common-mode and differential difference signals in response to differential input signals; said circuit providing a common-mode feedback signal in response to said plurality of common-mode difference signals;
wherein said circuit includes a differential input stage which provides inverting and non-inverting difference signals in response to inverting and non-inverting input signals in said differential input signals;
wherein said circuit further comprises an output stage coupled to said differential input stage, said output stage providing said plurality of common-mode and differential difference signals;
and wherein said output stage includes first and second current mirror circuits which provide said plurality of common-mode and differential difference signals, respectively.

2. The comparator of claim 1, wherein said circuit provides said plurality of common-mode difference signals in response to said inverting and non-inverting difference signals.

3. The comparator of claim 1, further including a common-mode output stage coupled to said first current mirror circuit, said common-mode output stage providing said common-mode feedback signal in response to said plurality of common-mode difference signals.

4. The comparator of claim 1, further including a comparator output stage coupled to said second current mirror circuit, said comparator output stage providing an output signal in response to said plurality of differential difference signals.

5. A comparator, comprising:
a circuit with multiple differential inputs;
said multiple differential inputs receiving separate differential input signals;
said circuit providing a plurality of common-mode difference signals in response to said differential input signals;
wherein said circuit further comprises a differential amplifier input stage with a first differential amplifier which provides first and second non-inverting difference signals in response to first and second non-inverting input signals from said differential input signals;
and wherein said differential amplifier input stage includes a second differential amplifier which provides first and second inverting difference signals in response to first and second inverting input signals from said differential input signals.

6. The comparator of claim 5, wherein said circuit provides a common-mode feedback signal in response to said plurality of common-mode difference signals.

7. The comparator of claim 5, wherein said common-mode difference signals are connected to drive the common-mode level of said comparator to a desired value.

8. The comparator of claim 5, wherein said circuit provides a plurality of differential difference signals in response to said differential input signals.

9. The comparator of claim 8, wherein said circuit provides an output signal in response to said plurality of differential difference signals.

10. The comparator of claim 5, wherein said circuit further comprises a differential amplifier input stage with a first differential amplifier which provides first and second non-inverting difference signals in response to first and second non-inverting input signals from said differential input signals.

11. The comparator of claim 5, wherein said circuit provides said plurality of common-mode difference signals with a non-inverting common-mode difference signal in response to said first inverting and non-inverting difference signals.

12. The comparator of claim 11, wherein said circuit adjusts said differential input signals to adjust said first inverting and non-inverting difference signals.

13. The comparator of claim 5, wherein said circuit provides said plurality of common-mode difference signals with an inverting common-mode difference signal in response to said second inverting and non-inverting difference signals.

14. The comparator of claim 13, wherein said circuit adjusts said differential input signals to adjust said second inverting and non-inverting difference signals.

15. The comparator of claim 5, wherein said circuit provides an inverting differential difference signal in response to said second non-inverting and first inverting difference signals.

16. The comparator of claim 15, wherein said circuit adjusts said second non-inverting and first inverting difference signals to adjust said inverting differential difference signal.

17. The comparator of claim 5, wherein said circuit provides a non-inverting differential difference signal in response to said first non-inverting and second inverting difference signals.

18. The comparator of claim 17, wherein said first non-inverting and second inverting difference signals are adjustable to adjust said non-inverting differential difference signal.

19. A method of adjusting the difference between the common-modes of an amplifier and one or more comparators, said method comprising:
sensing reference and amplifier output signals with said one or more comparators;
forming corresponding common-mode difference signals with at least one comparator in response to said reference and amplifier output signals;
and
providing a common-mode feedback signal from said at least one comparator in response to said corresponding common-mode difference signals, the common-mode difference between said differential amplifier and one or more comparators being adjusted in response to said common-mode feedback signal(s);
wherein each comparator provides a separate common-mode feedback signal in which the combination is used to adjust the common-mode level of said amplifier.

20. The method of claim 19, wherein the step of providing said common-mode feedback signal(s) includes providing voltage or current feedback to said amplifier.

21. The method of claim 19, further including adjusting said reference signals to adjust the common-mode level of said amplifier.

22. The method of claim 19, wherein the step of forming said common-mode difference signals includes combining said reference and amplifier output signals.

* * * * *